(12) United States Patent
Tangring

(10) Patent No.: US 12,453,227 B2
(45) Date of Patent: Oct. 21, 2025

(54) SEMICONDUCTOR COMPONENT AND METHOD FOR PRODUCING THE SAME

(71) Applicant: OSRAM Opto Semiconductors GmbH, Regensburg (DE)

(72) Inventor: Ivar Tangring, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 639 days.

(21) Appl. No.: 17/634,206

(22) PCT Filed: Jul. 30, 2020

(86) PCT No.: PCT/EP2020/071528
§ 371 (c)(1),
(2) Date: Feb. 9, 2022

(87) PCT Pub. No.: WO2021/028233
PCT Pub. Date: Feb. 18, 2021

(65) Prior Publication Data
US 2022/0320403 A1  Oct. 6, 2022

(30) Foreign Application Priority Data
Aug. 12, 2019 (DE) ..................... 10 2019 121 678.8

(51) Int. Cl.
*H10H 20/858* (2025.01)
*H10H 20/819* (2025.01)
(Continued)

(52) U.S. Cl.
CPC ...... *H10H 20/8581* (2025.01); *H10H 20/819* (2025.01); *H10H 20/84* (2025.01);
(Continued)

(58) Field of Classification Search
CPC ....... H01L 33/641; H01L 33/20; H01L 33/44; H01L 33/50; H01L 2933/0025;
(Continued)

(56) References Cited

U.S. PATENT DOCUMENTS 8,969,900 B2  3/2015  Sabathil et al.
9,324,920 B2  4/2016  Sabathil et al.
(Continued)

FOREIGN PATENT DOCUMENTS

| CN | 103190003 A | 7/2013 |
|---|---|---|
| EP | 2858129 A2 | 4/2015 |
| WO | 2013045399 A1 | 4/2013 |

*Primary Examiner* — Jacob Y Choi
*Assistant Examiner* — Ashley Nicole Blackwell
(74) *Attorney, Agent, or Firm* — Slater Matsil, LLP

(57) ABSTRACT

In an embodiment a component includes a semiconductor body, a converter layer, a filling layer and an intermediate layer arranged in a vertical direction between the semiconductor body and the converter layer, wherein the semiconductor body has a surface which faces the converter layer, is structured and has vertical recesses, wherein the vertical recesses are filled with a material of the filling layer that has a higher thermal conductivity than silicone, wherein the intermediate layer or the semiconductor body has a higher mechanical hardness than the filling layer, and wherein the structured surface of the semiconductor body has local elevations and local recesses, the structured surface including exclusively the surface of an n-type or a p-type semiconductor layer.

20 Claims, 10 Drawing Sheets

(51) Int. Cl.
*H10H 20/84* (2025.01)
*H10H 20/851* (2025.01)
*H10H 20/01* (2025.01)

(52) U.S. Cl.
CPC ......... *H10H 20/851* (2025.01); *H10H 20/034* (2025.01); *H10H 20/0361* (2025.01); *H10H 20/0365* (2025.01)

(58) Field of Classification Search
CPC .... H01L 2933/0041; H01L 2933/0075; H10H 20/8581; H10H 20/819; H10H 20/84; H10H 20/851; H10H 20/034; H10H 20/0361; H10H 20/0365; H10H 20/8582; H10H 20/8514
USPC .......................................................... 257/98
See application file for complete search history.

(56) References Cited

U.S. PATENT DOCUMENTS

| | | |
|---|---|---|
| 2010/0072489 A1 | 3/2010 | McLaurin et al. |
| 2012/0068215 A1 | 3/2012 | Lee et al. |
| 2014/0225149 A1 | 8/2014 | Sabathil et al. |
| 2015/0115278 A1 | 4/2015 | Ichikawa |
| 2015/0280072 A1 | 10/2015 | Nunotani et al. |
| 2016/0197244 A1 | 7/2016 | Steigerwald et al. |
| 2016/0372636 A1* | 12/2016 | Hwang ................ H01L 33/507 |
| 2016/0372643 A1* | 12/2016 | Kim ....................... H01L 33/22 |
| 2018/0114800 A1 | 4/2018 | Pan |
| 2018/0175261 A1 | 6/2018 | Yoo et al. |
| 2018/0331251 A1* | 11/2018 | Scholz ................... H10H 29/14 |
| 2019/0273191 A1 | 9/2019 | Tangring et al. |

\* cited by examiner

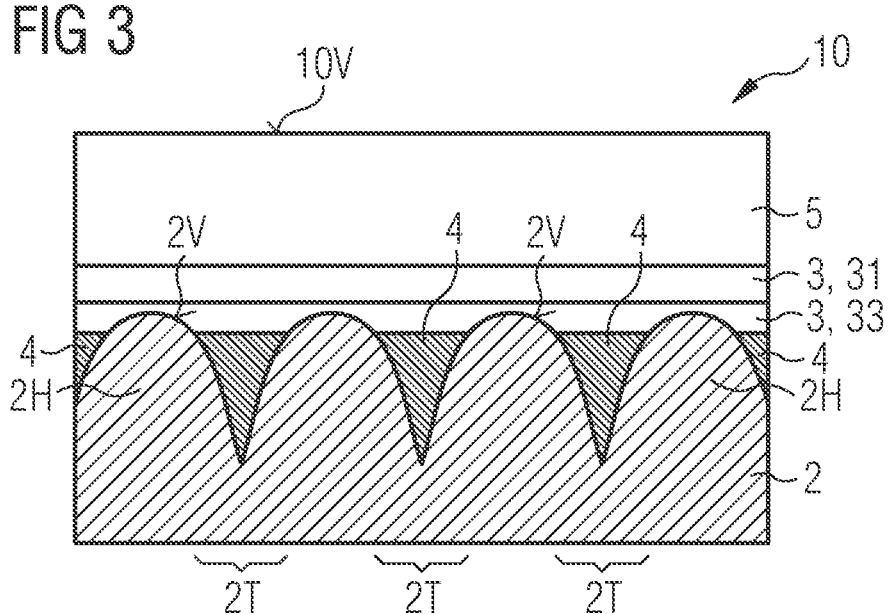
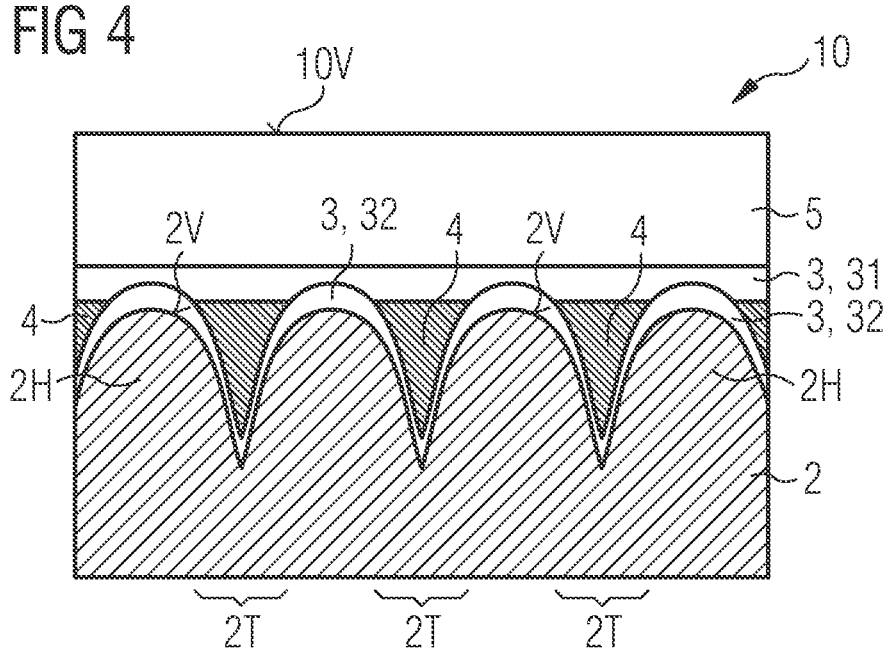

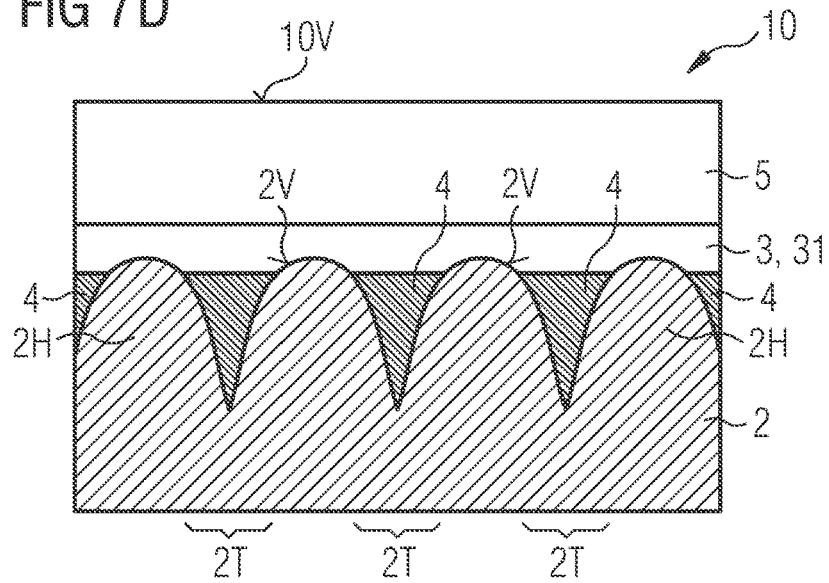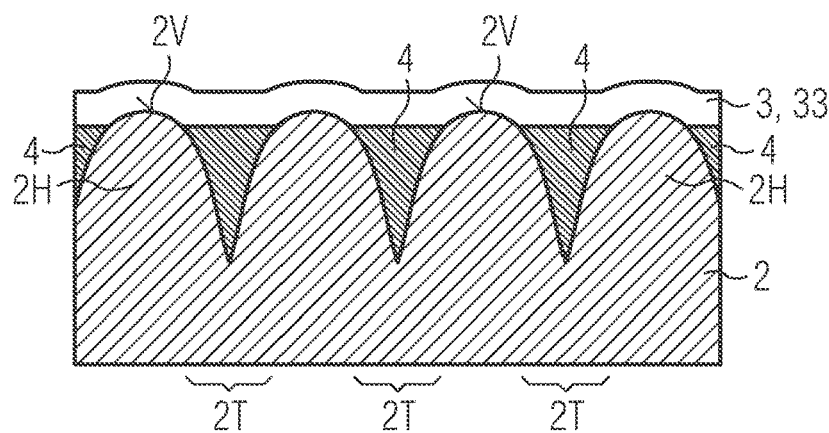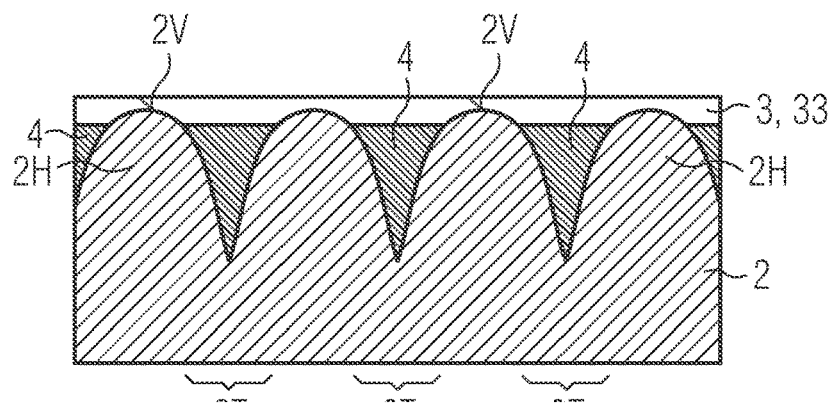

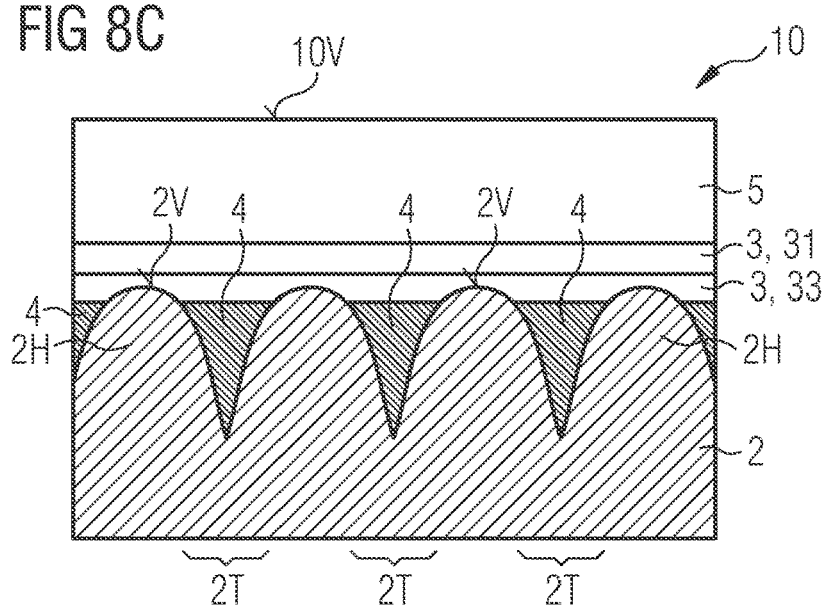
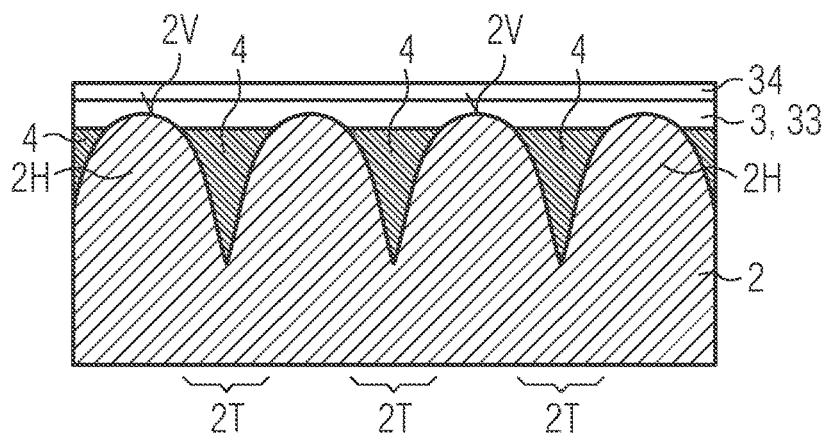
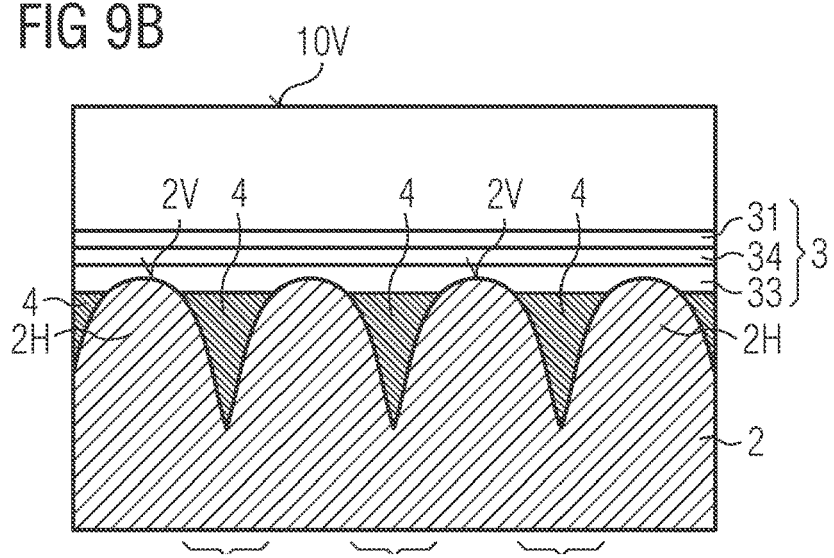

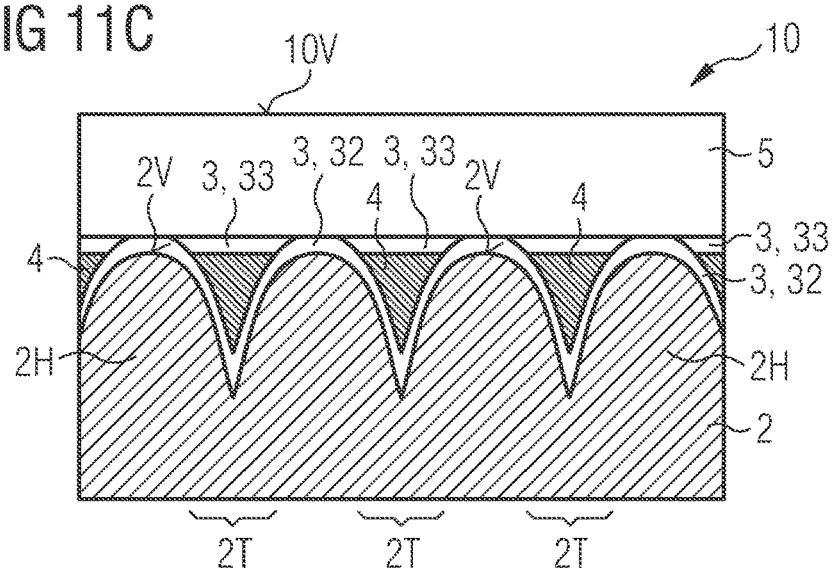
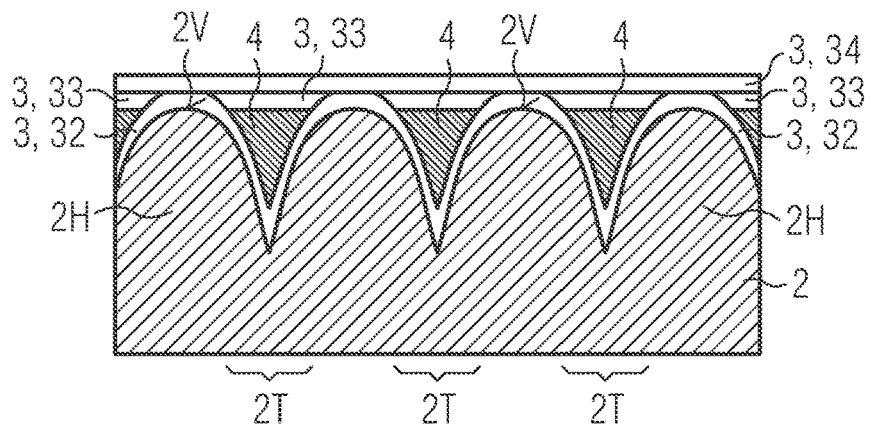
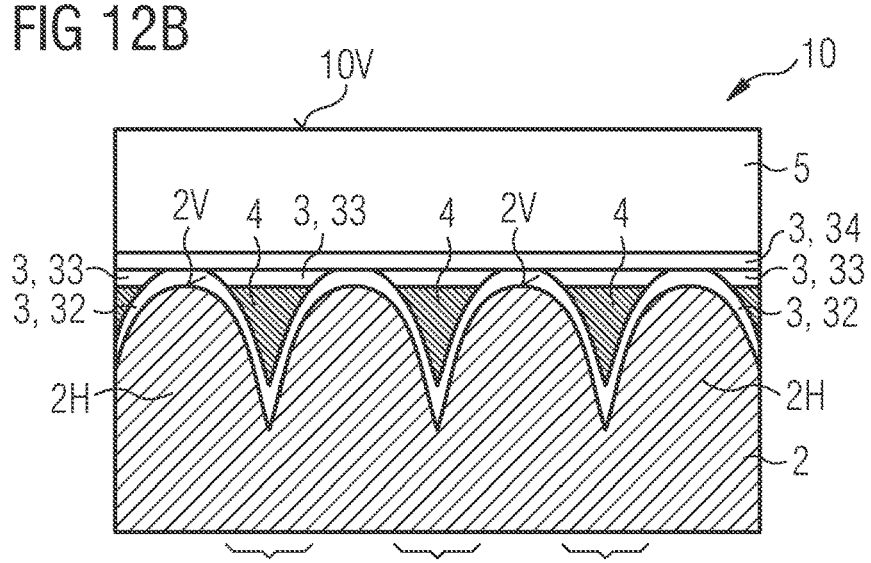

SEMICONDUCTOR COMPONENT AND METHOD FOR PRODUCING THE SAME

This patent application is a national phase filing under section 371 of PCT/EP2020/071528, filed Jul. 30, 2020, which claims the priority of German patent application 102019121678.8, filed Aug. 12, 2019, each of which is incorporated herein by reference in its entirety.

TECHNICAL FIELD

A component having improved heat dissipation and thus having improved efficiency is specified. Furthermore, a method for producing a component is specified.

BACKGROUND

The efficiency and lifetime of a light-emitting component depend, among other things, on whether heat of the component is sufficiently dissipated during operation. Often, a converter layer is attached to a structured surface of a semiconductor body of the component by a silicone-based connecting layer. However, by roughening the semiconductor body to achieve a high out-coupling efficiency, thermal barriers can be formed that make it difficult to cool down a converter layer of the component. Such thermal barriers are located in particular in the recesses of the semiconductor body, which are filled in particular with the material of the connecting layer.

To avoid the thermal barriers, the roughening of the semiconductor body can be omitted. However, this leads to a degradation of the optical out-coupling, since total reflection at a flat surface occurs more often when light shall pass to a material with a lower refractive index. Alternatively, it is conceivable that thermally conductive particles are mixed into the material of the connecting layer. However, there is a high risk that the heat-conducting particles lead to undesired optical scattering, as a result of which out-coupled light is reflected back to the semiconductor body.

SUMMARY OF THE INVENTION

Embodiments provide a component, in particular an optoelectronic component with increased efficiency. Further embodiments provide a reliable and cost-effective method for producing a component, in particular a component described here.

According to at least one embodiment of the component, the component comprises a carrier and a semiconductor body arranged on the carrier. The semiconductor body has a first semiconductor layer, a second semiconductor layer and an active zone, wherein the active zone is arranged in a vertical direction between the first semiconductor layer and the second semiconductor layer. In particular, the active zone is configured to generate electromagnetic radiation, for example, in the infrared spectral range, the visible spectral range, or in the ultraviolet spectral range. The first semiconductor layer and the second semiconductor layer may be n-type and p-type, respectively, or vice versa. The first semiconductor layer and the second semiconductor layer can each be formed as a single layer or as a layer sequence and/or have a plurality of partial layers arranged one above the other.

In particular, the semiconductor body has a diode structure. The active zone is, for example, a pn-junction region. The component may be a semiconductor conductor chip. The carrier is, for example, the chip carrier, in particular the only chip carrier of the component. The carrier may be a substrate, in particular a growth substrate. It is also possible that the carrier is different from a growth substrate and/or different from a printed circuit board.

The semiconductor body may be formed from a III-V compound semiconductor material. A III-V compound semiconductor material has an element from the third main group, for instance B, Al, Ga, In, and an element from the fifth main group, for instance N, P, As. In particular, the term "III-V compound semiconductor material" includes the group of binary, ternary or quaternary compounds containing at least one element from the third main group and at least one element from the fifth main group, for example nitride and phosphide compound semiconductors. Such a binary, ternary or quaternary compound may further include, for example, one or more dopants as well as additional constituents. Also, the semiconductor body may be formed of a II-VI compound semiconductor material.

According to at least one embodiment of the component, the semiconductor body has a structured surface facing away from the carrier. The structured surface has vertical recesses and vertical elevations having, for example, a vertical depth and an average vertical height between 0.2 µm and 5 µm inclusive, for instance between 1 µm and 5 µm inclusive or between 1 µm and 3 µm inclusive, respectively. The structured surface may be provided with a passivation layer, wherein the passivation layer runs conformally with the structured surface. The passivation layer may have a vertical layer thickness between 30 nm and 1 µm inclusive, for instance between 40 nm and 700 nm inclusive or between 100 nm and 700 nm inclusive. The passivation layer may be formed from $SiO_2$ and/or $Al_2O_3$.

A lateral direction is understood to be a direction that is in particular parallel to a main extension surface of the active zone or of the semiconductor body. A vertical direction is understood to mean a direction which is directed in particular perpendicularly to the main extension surface of the active zone or of the semiconductor body. The vertical direction and the lateral direction are for instance orthogonal to each other.

According to at least one embodiment of the component, the latter has a converter layer arranged on the structured surface of the semiconductor body. In particular, the converter layer is a prefabricated converter platelet. The converter layer may have phosphors that can convert the electromagnetic radiation, which is generated by the semiconductor body during operation of the component, with respect to its wavelength. This conversion generates heat, which is preferably to be dissipated via the semiconductor body and the carrier of the component.

According to at least one embodiment of the component, the filling layer is configured to adjust the refractive index between the semiconductor body and the converter layer or between the semiconductor body and the intermediate layer. The structured surface of the semiconductor body can also suppress effects related to total internal reflection. For example, the refractive index of the filling layer differs from the refractive index of the conversion layer or the intermediate layer by at most 30%, 20%, 10% or by at most 5%. In particular, the filling layer has a smaller refractive index than the conversion layer and/or the intermediate layer.

According to at least one embodiment of the component, the component has an intermediate layer arranged in the vertical direction between the semiconductor body and the converter layer. The intermediate layer may be formed by a connecting layer and/or by the passivation layer. Also, the intermediate layer may be formed by a protection layer or a planarization layer.

The intermediate layer can be single-layered or multilayered. If the intermediate layer is single-layered, it can be formed from a single material. If the intermediate layer is multilayered, it can have a plurality of partial layers arranged one above the other, which are formed in particular from different materials.

In at least one embodiment, the component comprises a semiconductor body, a converter layer, a filling layer and an intermediate layer arranged in the vertical direction between the semiconductor body and the converter layer. The semiconductor body has a surface which faces the converter layer, is structured and has vertical recesses. The vertical recesses are filled with a material of the filling layer which has a higher thermal conductivity than silicone and/or epoxy resin. As a result, thermal paths can be formed between the converter layer and the semiconductor body throughout the recesses during operation of the component, wherein the thermal paths dissipate heat in particular significantly better than silicone and/or epoxy resin. In particular, the intermediate layer and/or the semiconductor body have/has a higher mechanical hardness than the filling layer.

Due to the material of the filling layer, thermal paths throughout the recesses can be formed more easily during operation of the component, as a result of which heat can be lead from the converter layer into the semiconductor body not only via the elevations of the semiconductor body but also via the recesses of the semiconductor body. In a transition region between the semiconductor body and the converter layer, heat is thus comparatively uniformly distributed, as a result of which heat is effectively transmitted into the semiconductor body over a larger area. With the use of the filling layer, the lowest possible thermal resistance between the converter layer and the component can thus be realized. This enables a higher operating current and thus more light output.

Preferably, the filling layer is formed from a dielectric which has a higher thermal conductivity than polymers for instance silicone or epoxy. In particular, the filling layer is formed in such a way that it is transparent and, in particular, transmissive to the radiation generated by the semiconductor body. By using a highly thermally conductive material to fill the recesses of the structured surface of the semiconductor body, heat dissipation can be significantly improved, while the out-coupling efficiency of the component is not negatively affected. In particular, the filling layer is free of additional heat conducting particles embedded in the material of the filling layer.

Especially when polishing a surface with materials of different hardness, the softer material is usually removed more easily, so that in unfavorable cases the surface is not flat, but curved in places. This phenomenon is known as "dishing". After the polishing step, it is often desirable for the polished surface to be planarized, which allows the converter layer to be easily attached to the polished surface in a material-saving manner. In this case, the intermediate layer or a connecting layer can be formed to be particularly thin, which minimizes thermal resistance in a transition region between the semiconductor body and the converter layer.

If the semiconductor body or the intermediate layer has a higher mechanical hardness than the filling layer, the semiconductor body or the intermediate layer can serve in particular as a polishing stop layer during the processing of the filling layer, which simplifies a method for producing such a component.

According to at least one embodiment of the component, the structured surface of the semiconductor body has local elevations and local recesses. In particular, the structured surface is formed exclusively by the surface of an n-type or p-type semiconductor layer. In particular, the local elevations and/or local recesses do not extend throughout the active zone. The elevations or recesses are located, for example, exclusively on an n-side or exclusively on a p-side of the semiconductor body.

Even if the semiconductor layer is formed to be n-conductive or p-conductive, it is not absolutely necessary for it to be n- or p-doped. For example, the semiconductor layer can have regions that are highly doped, low doped or not doped. The part of the semiconductor body that is roughened can ideally be only slightly doped or undoped, for example, since the doping atoms generally absorb light. The patterned regions may be formed to be contiguous or non-contiguous. If the patterned regions are formed to be non-contiguous, it is possible that they hardly contribute or do not contribute to current conduction. However, it is possible that the structured regions of the semiconductor body—depending on growth conditions—may be doped, in particular slightly doped. If the structured regions are slightly doped, it is possible that they only have traces of doping atoms.

According to at least one embodiment of the component, the semiconductor body has a higher mechanical hardness than the filling layer. Along the vertical direction, the semiconductor body protrudes beyond the filling layer in places. In this case, the structured surface of the semiconductor body can be free of a passivation layer.

According to at least one embodiment of the component, the intermediate layer has a higher mechanical hardness than the filling layer. The intermediate layer extends regionally into the recesses, wherein the intermediate layer runs conformally with the structured surface of the semiconductor body. In particular, the intermediate layer protrudes along the vertical direction in places beyond the filling layer.

According to at least one embodiment of the component, the semiconductor body is configured to generate electromagnetic radiation of first peak wavelength during operation of the component. The converter layer is configured to convert the first peak wavelength electromagnetic radiation into second peak wavelength electromagnetic radiation, wherein the second peak wavelength is larger than the first peak wavelength. For example, in operation of the component, the semiconductor body is configured to generate electromagnetic radiation in the ultraviolet or in the blue spectral range, wherein the radiation is partially or completely converted by the converter layer into radiation of longer wavelength, for instance in the yellow, green or red spectral range.

According to at least one embodiment of the component, the material of the filling layer has a thermal conductivity of at least 0.5 W/(m·K). For example, the thermal conductivity of the filling layer is at least 0.75 W/(m·K), 1 W/(m·K), 1 W/(m·K), or at least 5 W/(m·K). The thermal conductivity of the material of the filling layer may be between 0.5 W/(m·K) and 150 W/(m·K) inclusive, for instance between 1 and 100 W/(m·K) inclusive, between 1 W/(m·K) and 10 W/(m·K) inclusive, or between 1 W/(m·K) and 5 W/(m·K) inclusive. The filling layer is, for example, homogeneously formed from a material and can be free of additional filler particles or of heat conducting particles.

According to at least one embodiment of the component, the material of the filling layer has a lower thermal conductivity than that of the semiconductor body. Semiconductor materials based on GaN, for example, can have a particularly high thermal conductivity, namely around 100 W/(m·K). The semiconductor body of the component is thus particularly suitable for thermal conduction for cooling the converter layer.

According to at least one embodiment of the component, the vertical recesses have an average vertical depth between 0.2 µm and 5 µm inclusive. The filling layer may be formed to fill at least 50%, 60% or at least 70%, for example between 50% and 90% inclusive or between 50% and 80% inclusive, of the vertical depth of the recesses.

According to at least one embodiment of the component, the intermediate layer comprises a connecting layer or is formed from the connecting layer. The connecting layer is arranged in the vertical direction between the filling layer and the converter layer. In particular, the connecting layer is different from a connecting layer based on silicone or on an epoxy material. In particular, the connecting layer is formed to be radiation-transmissive, for instance transparent to electromagnetic radiation generated in the semiconductor body. The connecting layer may be formed of glass or of an adhesive. It is also possible that the interconnection is made of a thin silicone-based layer with a layer thickness smaller than 1 µm, 0.5 µm, 0.2 µm, 0.1 µm, 0.05 µm, for instance between 10 nm and 1 µm inclusive.

According to at least one embodiment of the component, the intermediate layer comprises or is formed from a passivation layer. The passivation layer runs in regions conformally with the structured surface of the semiconductor body and is arranged in the vertical direction in regions between the filling layer and the semiconductor body. In particular, the passivation layer has a higher mechanical hardness than the filling layer. The passivation layer can be formed of Al2O3.

According to at least one embodiment of the component, it has a planarization layer which, in top view, completely covers the filling layer and has a flat or planar surface facing the converter layer. The planarization layer and the passivation layer can be formed from the same material, for instance Al2O3, or from different materials.

A flat surface is to be understood in particular to be a surface which is plane and, within the producing tolerances, has a roughness of at most 1 µm, 0.5 µm, 0.3 µm or 0.1 µm, for example between 0.05 µm and 1 µm inclusive. A planar surface is to be understood in particular to be a surface which is particularly flat and, within the producing tolerances, has a roughness of at most 100 nm, 50 nm, 30 nm, 20 nm or 10 nm, for example between 1 nm and 100 nm inclusive.

In the presence of such a planarization layer, the converter layer can be attached to the semiconductor body by a particularly thin connecting layer. It is also possible that the converter layer is attached to the semiconductor body by a direct bond process. In a direct bond process, planarized surfaces, for instance the surfaces of the converter layer and the planarization layer or a protection layer arranged on the planarization layer, are brought into physical contact. The basis of the mechanical bonding is predominantly or exclusively hydrogen bonds and/or van der Waals interactions in the immediate vicinity of a common interface between the planarized surfaces. To generate covalent bonds between atoms or molecules on the surfaces in physical contact, thermal treatment can be applied subsequently to achieve increased bond strength. Direct bonding thus takes place in particular without the use of an additional bonding material, for example in the form of an adhesive layer or a solder layer.

According to at least one embodiment, the component includes a protection layer arranged between the converter layer and the semiconductor body. In particular, the protection layer has a constant vertical layer thickness along lateral directions. For example, the protection layer is directly to the converter layer up or directly adjacent to the converter layer up to a connecting layer. In particular, the protection layer has a planar surface facing the converter layer.

In one embodiment of an electronic device, it comprises the component described herein. The electronic device may be a smartphone, touchpad, laser printer, recognition camera, display, or a system of LEDs, sensors, laser diodes, and/or detectors. The component may further have application in a light source. For example, the component is intended for use in general lighting, for instance indoor or outdoor lighting. The component may be implemented as a light source for a headlight, for instance a motor vehicle headlight. For example, the component is a high power LED.

In at least one embodiment of a method for producing a component comprising a semiconductor body, a converter layer, a filling layer and an intermediate layer arranged in vertical direction between the semiconductor body and the converter layer, the semiconductor body is provided with a structured surface. The structured surface has vertical recesses. The recesses are filled with a material of the filling layer which has a higher thermal conductivity than silicone. In addition, the material of the filling layer is selected such that the intermediate layer or the semiconductor body has a higher mechanical hardness than the filling layer. In a subsequent method step, the filling layer is polished, for example by a chemical-mechanical planarization process, with the intermediate layer or semiconductor body serving as a polishing stop layer due to its higher mechanical hardness. After polishing, the intermediate layer or the semiconductor body protrudes in places along the vertical direction beyond the filling layer. The converter layer is applied to the polished filling layer. Preferably, the material of the filling layer is selected with respect to thermal conductivity in such a way that during operation of the component, thermal paths between the converter layer and the semiconductor body can be generated through the recesses due to the material of the filling layer.

According to at least one embodiment of the method, the structured surface of the semiconductor body has local elevations and local recesses, wherein the structured surface are formed exclusively by the surface of an n-type or p-type semiconductor layer. The local elevations and local recesses are formed in particular such that the elevations or recesses do not extend through the active zone. The elevations or recesses are located in particular exclusively on an n-side or exclusively on a p-side of the semiconductor body.

According to at least one embodiment of the method, after polishing, the semiconductor body protrudes in places along the vertical direction beyond the filling layer. After polishing of the filling layer, the intermediate layer is applied to the partially exposed semiconductor body. The intermediate layer can be subsequently plane-polished, for example by a chemical-mechanical planarization process, as a result of which it has a plane or planar surface facing away from the semiconductor body. In particular, the intermediate layer is contiguous and formed from one single material. In particular, the intermediate layer thus has the same mechanical hardness everywhere and can therefore be planarized in a simple manner.

According to at least one embodiment of the method, the intermediate layer is applied to the semiconductor body prior to the filling layer, so that the intermediate layer partially fills the recesses. The recesses can be completely filled with the material of the filling layer. In a subsequent method step, the filling layer is polished, with the underlying intermediate layer serving in particular as a polishing stop layer due to its higher mechanical hardness. After polishing, the intermediate layer can project beyond the filling layer in places along the vertical direction.

Compared with the filling layer, the intermediate layer has in particular a harder material, so that the intermediate layer can serve as a polishing stop layer. In particular, abrasive particles are used for polishing which remove the filling layer, i.e. the softer layer, more quickly and remove the intermediate layer, i.e. the harder layer, more slowly or hardly at all. In particular, the abrasive particles have a mechanical strength between the two materials to be polished. Ideally, it can lead to achieving the same layer thickness or a planar surface in the end, despite differences in the polishing removal rate, because the process of polishing automatically stops or slows down. In practice, however, a planar surface is hardly achievable due to the dishing effect.

According to at least one embodiment of the method, a planarization layer is applied to the filling layer and to the intermediate layer which is exposed in places. The planarization layer can counteract the dishing effect mentioned here. The planarization layer can be subsequently planarized, for example by a chemical-mechanical planarization process, as a result of which it can have a flat or planar surface facing away from the semiconductor body.

The intermediate layer can be a hard passivation layer formed from Al2O3, for example. The passivation layer can have a vertical layer thickness between 100 nm and 700 nm inclusive, for instance between 200 nm and 400 nm inclusive. In particular, the filling layer is formed from a softer material than the material of the passivation layer. The filling layer, for example of SiO2, MgO or MgF2, can initially have a vertical layer thickness between 1 µm and 10 µm inclusive or between 1 µm and 5 µm inclusive, which is subsequently polished in such a way that the passivation layer is exposed in places. In a subsequent method step, a planarization layer formed from Al2O3, for example, can be applied to the polished surface to even out the dishing. The planarization layer can be subsequently polished so that it has a flat or planar surface facing away from the semiconductor body.

It is possible to apply an additional protection layer, for example made of SiO2, to the flat or planar surface of the planarization layer, in particular by a coating process. The protection layer can have a vertical, in particular constant, layer thickness. If necessary, the protection layer can be subsequently planarized.

According to at least one embodiment of the method, the converter layer is attached to the semiconductor body by a bonding material, in particular by glass solder. The bonding material may be formed of a polymer or of silicone. In this case, the two bonded surfaces can be made so flat that the connecting layer is made particularly thin, which means that the thermal resistance of the connecting layer is of little significance. The vertical layer thickness of the connecting layer can be smaller than 1 µm, 0.5 µm, 0.2 µm, 0.1 µm, 0.05 µm, for instance between 10 nm and 1 µm inclusive.

Alternatively, it is possible that the converter layer is attached to the semiconductor body using a direct bond process.

The method described here is particularly suitable for the production of a component described here. The features described in connection with the component can therefore also be used for the method and vice versa.

BRIEF DESCRIPTION OF THE DRAWINGS

Further developments and further embodiments of the component or of the method for producing the component will be apparent from the exemplary embodiments explained below in connection with FIGS. 1A to 12B.

FIGS. 7A, 7B, 7C and 7D show schematic representations of various steps of an exemplary embodiment of a method for producing a component in sectional views, and FIGS. 8A, 8B, 8C, 9A, 9B, 10A, 10B, 10C, 10D, 11A, 11B, 11C, 12A and 12B show schematic representations of various steps of further embodiments of a method for producing a component in sectional views.

Figure 1A:
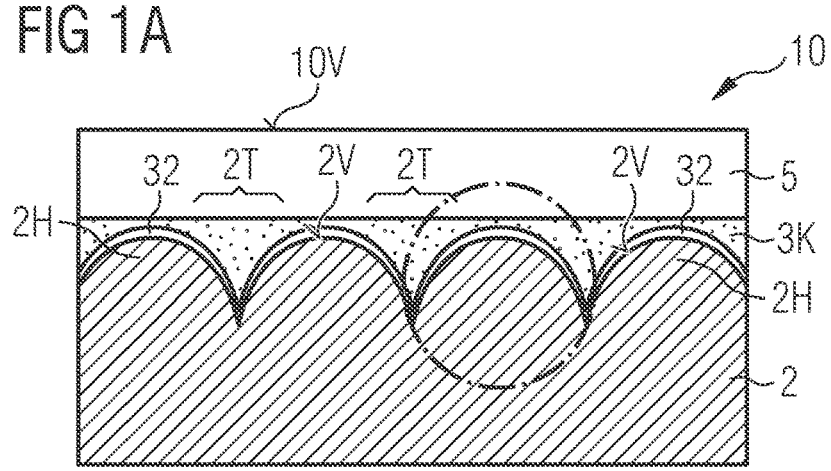
FIG. 1A shows schematic illustration of a comparative example of a component having a silicone-based adhesive layer.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

FIG. 1A shows a comparative example of a component 10 having a semiconductor body 2 and a converter layer 5, wherein the converter layer 5 is mechanically connected to the semiconductor body 2 by a connecting layer 3K. The semiconductor body 2 has a surface 2V which faces the converter layer 5, is formed in a structured manner and has recesses 2T and elevations 2H. The recesses 2T and the elevations 2H are provided with a passivation layer 32, wherein the passivation layer 32 runs substantially conformally with the structured surface 2V.

The component 10 is in particular a light-emitting component, for instance an LED chip, wherein the semiconductor body 2 is configured to generate electromagnetic radiation of first peak wavelength, which is scattered at the structured surface 2V during operation of the component and is coupled into the converter layer 5. In particular, the converter layer 5 contains phosphors that at least partially convert the radiation of first peak wavelength into electromagnetic radiation of second peak wavelength, wherein the second peak wavelength is larger than the first peak wavelength. Since the radiation of first peak wavelength is smaller and thus more energetic than the radiation of second peak wavelength, large amount of heat is released in the converter layer 5, which is to be conducted away from the converter layer 5 during operation of the component 10.

On the one hand, heat can be dissipated directly to the environment of the component 10, for instance via a front side 10V of the component 10, which is formed, for example, by a surface of the converter layer 5 and can be formed as a radiation exit surface of the component 10. On the other hand, heat may be dissipated via the connecting layer 3K, the passivation layer 32 and the semiconductor body 2, for example, to a heat sink on which the component 10 is disposed. The heat sink may be a metal body or a circuit board. Heat dissipation to the heat sink proves to be much more effective than heat dissipation to the surroundings of the component 10, since the surrounding air conducts heat relatively poorly. Good heat dissipation plays a crucial role with respect to achieving high efficiency of the component 10. If the converter layer 5 is heated too much, both the efficiency and the lifetime of the component 10 may be negatively affected.

According to the comparative example of the component 10 shown in FIG. 1A, the connecting layer 3K is a silicone-based connecting layer. In this case, the recesses 2T are substantially filled with silicone. However, silicone has a relatively low thermal conductivity, namely of about 0.15 W/(m·K). Particularly in the regions of the recesses 2T, thermal barriers can thus be formed to block thermal conduction from the converter layer 5 to the semiconductor body 2. This makes it more difficult for the converter layer 5 to cool down overall.

Figure 1B:
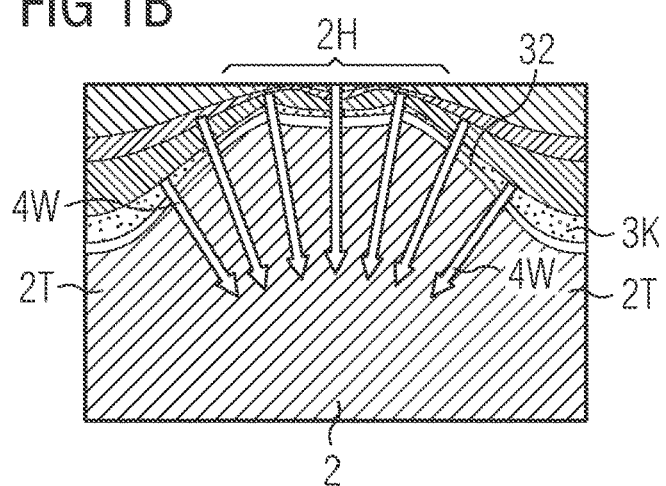
FIGS. 1B and 1C show simulations illustrating heat distribution in a component shown in FIG. 1A.
Figure 1C:
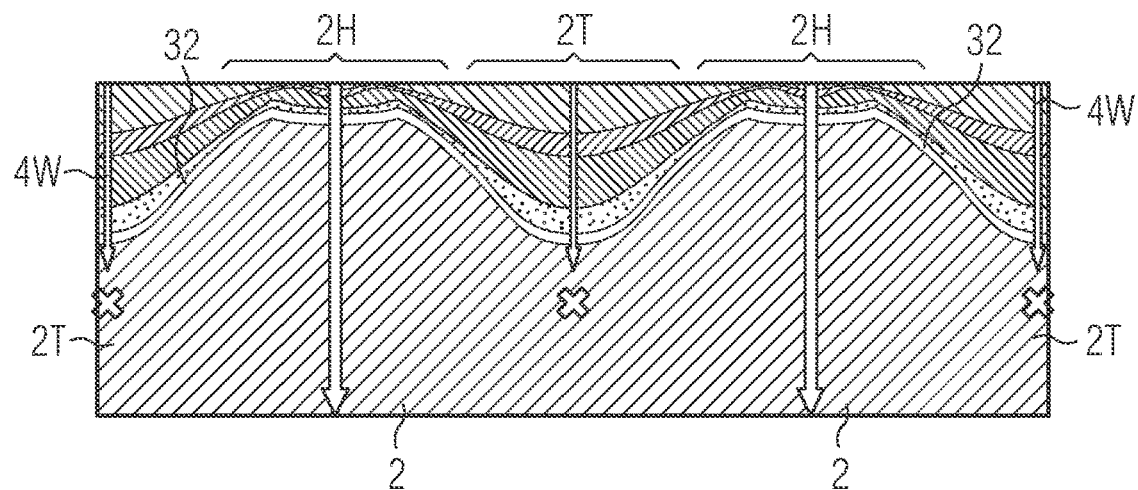

FIG. 1B shows a simulation of the heat distribution in the immediate vicinity of an elevation 2H which is marked for instance in FIG. 1A. It has been found that thermal paths 4W are formed in this case mainly through the elevations 2H of the semiconductor body 2. Due to the comparatively poorer thermal conductivity in the recesses 2T, hardly any heat exchange takes place here between the converter layer 5 and the semiconductor body 2. As a result, the heat within the converter layer 5 and in a transition region between the semiconductor body 2 and the converter layer 5 is not evenly distributed, and the heat dissipation is thus not optimally formed. FIG. 1C shows a simulation of heat distribution in a transition region between the converter layer 5 and the semiconductor body 2. It can be seen in FIG. 1C that heat conduction from the converter layer 5 to the semiconductor body 2 is impeded or blocked, particularly in the recesses 2T that are filled with silicone, for example.

The simulations show that the thermal resistance is about 3 K/W when the converter layer 5 lies flat on the peaks of the roughening. This corresponds to a thermal resistance of a silicone layer with a thickness of 0.5 µm. For a component with a luminous area of 1 mm$^2$ at a current of 3 A, this means a temperature increase of 3° C. For a high-power chip operated at 5-10 A/mm$^2$, this corresponds to a temperature increase of 5-10° C. This temperature increase would have a significant impact on the efficiency and lifetime of the component.

Figure 2A:
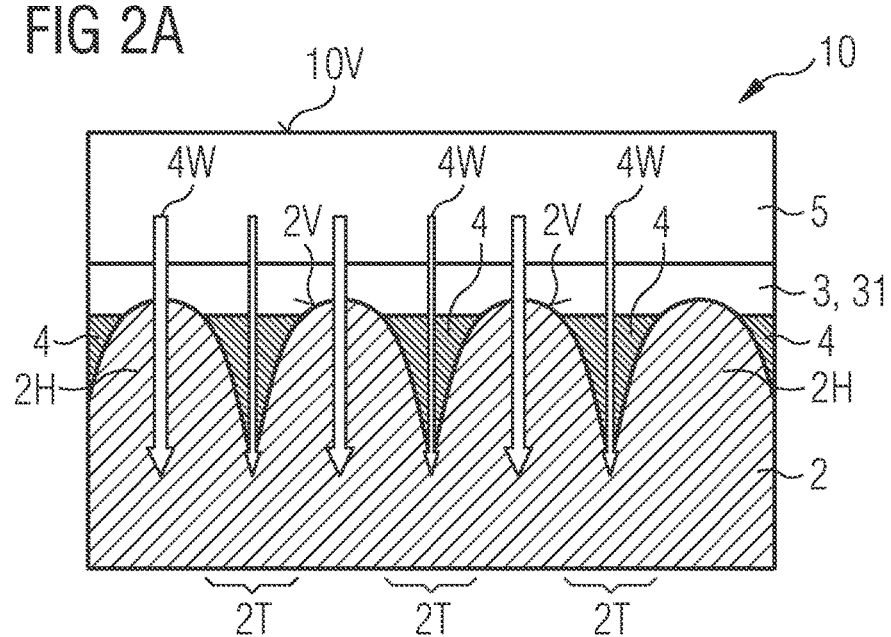
FIG. 2A shows schematic representation of an embodiment of a component in sectional view.

The embodiment of a component 10 shown in FIG. 2A is substantially the same as the embodiment shown in FIG. 1A. In contrast, the component 10 does not have a silicone-based connecting layer 3K. Instead of the connecting layer 3K, the component 10 shown in FIG. 2A has a filling layer 4 and an intermediate layer 3. The filling layer 4 at least partially fills the recesses 2T. Along the vertical direction, the semiconductor body 2, in particular the plurality of elevations 2H of the semiconductor body 2, extends beyond the filling layer 4 in the direction of the converter layer 5. Thus, the filling layer 4 does not run conformally with the structured surface 2V.

The filling layer 4 is formed from a material which preferably has a higher thermal conductivity than silicone or an epoxy resin. For example, the filling layer 4 is formed from a dielectric material, for instance from SiO2, MgO, MgF2 or Al2O3. SiO2 has a thermal conductivity of about 1 W/(m·K). In particular, the filling layer 4 may have a lower thermal conductivity than the semiconductor body 2 or than the material of the elevations 2H. The filling layer 4 is formed of a material which in particular has a lower mechanical hardness than the material of the semiconductor body 2 or of the elevations 2H.

According to FIG. 2A, the filling layer 4 does not run conformally with the structured surface 2V of the semiconductor body 2 in the regions of the recesses 2T. Rather, the material of the filling layer 4 completely fills the recesses 2T up to a vertical height at which the elevations 2H project beyond the filling layer 4. Both the filling layer 4 and the elevations 2H are in particular directly adjacent to the intermediate layer 3.

The intermediate layer 3 can be a connecting layer 31 formed from a material that has a higher thermal conductivity than silicone or epoxy resin. In particular, the connecting layer 31 is a radiation-transmissive, especially transparent connecting layer, for instance a glass connection or a glass solder connecting layer. It is possible that the intermediate layer 3 has a higher thermal conductivity than the filling layer 4. By the intermediate layer 3 formed as a connecting layer 31, the converter layer 5 is mechanically stably attached to the semiconductor body 2.

Figure 2B:
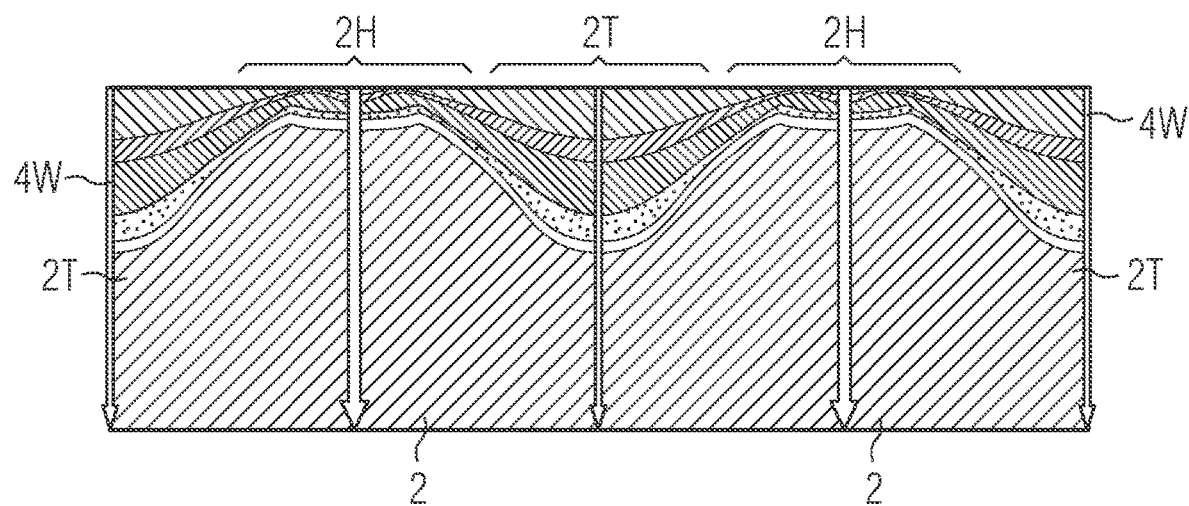
FIG. 2B shows a simulation illustrating the heat distribution in a component according to FIG. 2A, FIGS. 3, 4, 5 and 6 show schematic representations of various embodiments of a structural element in sectional views.

Due to the relatively high thermal conductivity of the filling layer 4, thermal paths 4W can be formed from the converter layer 5 through the recesses 2T to the semiconductor body 2 during operation of the component 10. Thus, thermal paths 4W are formed not only outside the recesses 2T but also inside the recesses 2T, which are thus distributed over the entire structured surface 2V, as a result of which a relatively uniform heat distribution is achieved in the transition region between the semiconductor body 2 and the converter layer 5. A simulation of the heat distribution in a component 10 according to FIG. 2A is schematically shown in FIG. 2B. In contrast to FIG. 1C, FIG. 2B shows a significant improvement in the heat distribution on the structured surface 2V without negatively affecting the outcoupling efficiency.

According to FIG. 2A, the filling layer 4 is directly adjacent to the structured surface 2V of the semiconductor body 2 and thus directly adjacent to the semiconductor body 2. Deviating from this, it is possible that the structured surface 2V is provided with a passivation layer 32. Such a passivation layer 32 is schematically shown, for example, in FIG. 1A. The passivation layer 32 may have a higher thermal conductivity and/or a higher mechanical hardness than the filling layer 4. For example, the passivation layer 32 is formed of Al2O3.

The recesses 2T shown in FIG. 2A have a vertical depth, in particular a mean vertical depth, which is between 0.2 µm and 7 µm inclusive, for instance between 1 µm and 5 µm inclusive or between 1 µm and 3 µm inclusive. Accordingly, the elevations 2H may have a vertical height, in particular a mean vertical height, which is for instance equal to the vertical depth of the recesses 2T.

For example, the filling layer 4 has a local maximum layer thickness that is smaller than the maximum height of the elevations 2H or the maximum depth of the recesses 2T. In other words, the filling layer 4 only partially fills the recesses 2T. The elevations 2H protrude in places beyond the filling layer 4 in the direction of the converter layer 5. In top view of the structured surface 2V, the filling layer 4 may still be contiguous. The peaks of the elevations 2H project beyond the filling layer 4 and can be regarded as isolated islands on the filling layer 4.

The exemplary embodiment of a component 10 shown in FIG. 3 essentially corresponds to the embodiment shown in FIG. 2. In contrast, the component 10 according to FIG. 3 has a planarization layer 33. The planarization layer 33 is formed of a material which, in particular, has a higher mechanical hardness than SiO2 or than the material of the filling layer 4. In top view, the planarization layer 33 can completely cover the recesses 2T and the elevations 2H, i.e. the structured surface 2V. The planarization layer 33 has a surface which faces the converter layer 5, and is in particular flat or planar. Due to such a surface, it is possible to save on bonding material, which means that the connecting layer 31 can be formed to be particularly thin. The heat dissipation from the converter layer 5 to the semiconductor body 2 can thus be further improved.

According to FIG. 3, the intermediate layer 3 can be formed exclusively from the connecting layer 31 or exclusively from the planarization layer 33. It is also possible for the intermediate layer 3 to have two partial layers arranged one above the other, one of which is the connecting layer 31 and the other the planarization layer 33.

Deviating from FIG. 3, the component 10 can be free of a connecting layer 31. In this case, the converter layer 5 is in particular directly adjacent to the flat or planar surface of the planarization layer 33. For example, the converter layer 5 can be mechanically attached to the planarization layer 33 by a direct bonding process. In this case, the converter layer 5 may have a planar surface facing the semiconductor body 2. The converter layer 5 and the planarization layer 33 may have a common planar interface formed by overlapping regions between the planar surfaces of the converter layer 5 and of the planarization layer 33, wherein the common interface is in particular free of a bonding material, for instance, free of an adhesive or a solder material.

The exemplary embodiment of a component 10 shown in FIG. 4 essentially corresponds to the exemplary embodiment shown in FIG. 2. In contrast thereto, the component 10 according to FIG. 4 has a passivation layer 32 which is arranged between the semiconductor body 2 and the filling layer 4. In particular, the passivation layer 32 extends conformally with the structured surface 2V of the semiconductor body 2 and does not completely fill the recesses 2T. The passivation layer 32 merely extends into the recesses 2T and out of the recesses 2T again. In top view, the passivation layer 32 may completely cover the structured surface 2V.

In particular, the passivation layer 32 protrudes in places beyond the filling layer 4. In top view, the filling layer 4 may be contiguous, and the filling layer 4 may have a plurality of openings from which the peaks of the passivation layer 32 protrude. In FIG. 4, it is shown that the semiconductor body 2 or the plurality of elevations 2H do not protrude from the filling layer 4. Along the vertical direction, the filling layer 4 may protrude beyond the semiconductor body 2 and, in a top view of the structured surface 2, may cover the semiconductor body 2 in places but not completely. Deviating from FIG. 4, it is possible that the semiconductor body 2 or the plurality of elevations 2H protrude in regions beyond the filling layer 4 in the direction of the converter layer 5.

According to FIG. 4, the intermediate layer 3 can be formed exclusively from the passivation layer 32 or exclusively from the connecting layer 31. It is also possible for the intermediate layer 3 to have two partial layers arranged one above the other, one of which is the connecting layer 31 and the other the passivation layer 32.

Figure 5:
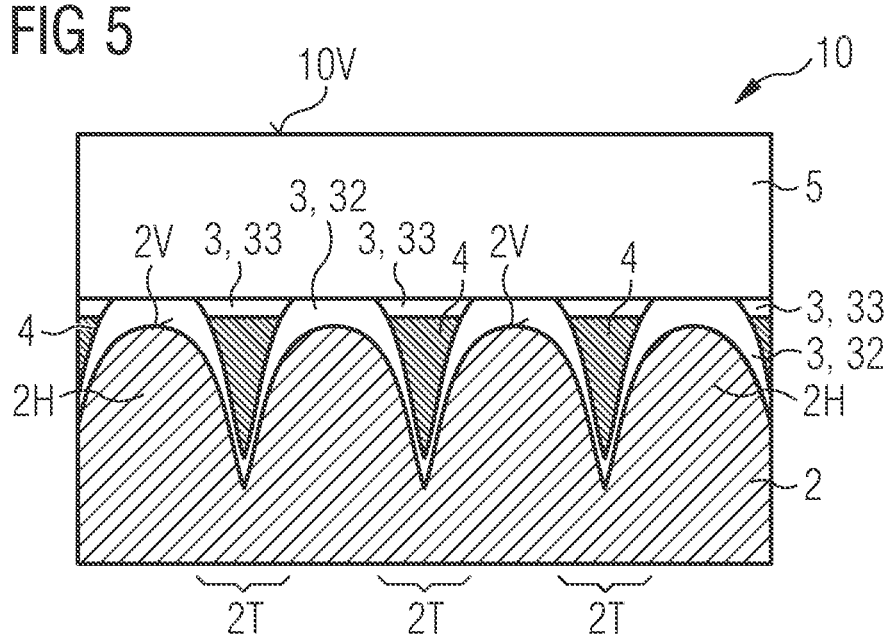

The exemplary embodiment of a component 10 shown in FIG. 5 essentially corresponds to the exemplary embodiment shown in FIG. 4. In contrast, the component 10 according to FIG. 5 additionally has a planarization layer 33. In particular, the planarization layer 33 and the passivation layer 32 have surfaces facing the converter layer 5, which together form a common, in particular flat or planar surface. Thus, the passivation layer 32 and the planarization layer 33 are flush with each other along the vertical direction and thus have a hybrid surface. The passivation layer 32 and the planarization layer 33 may be formed from the same material or from different materials. For example, the passivation layer 32 and the planarization layer 33 have substantially the same hardness and/or the same removal rate during polishing.

According to FIG. 5, the intermediate layer 3 can be formed exclusively from the passivation layer 32 or exclusively from the planarization layer 33 or in places from the passivation layer 32 and in places from the planarization layer 33.

According to FIG. 5, the converter layer 5 is directly adjacent to the passivation layer 32 and the planarization layer 33. The converter layer 5 can be mechanically stably attached to the common, in particular planar surface of the passivation layer 32 and the planarization layer 33 on the semiconductor body 2 by a direct bonding process. Deviating from FIG. 5, it is possible that a connecting layer 31 is used to attach the converter layer 5 to the passivation layer 32 and/or to the planarization layer 33. Furthermore, it is possible that the planarization layer 33 is formed in such a way that it completely covers the passivation layer 32 in top view.

Figure 6:
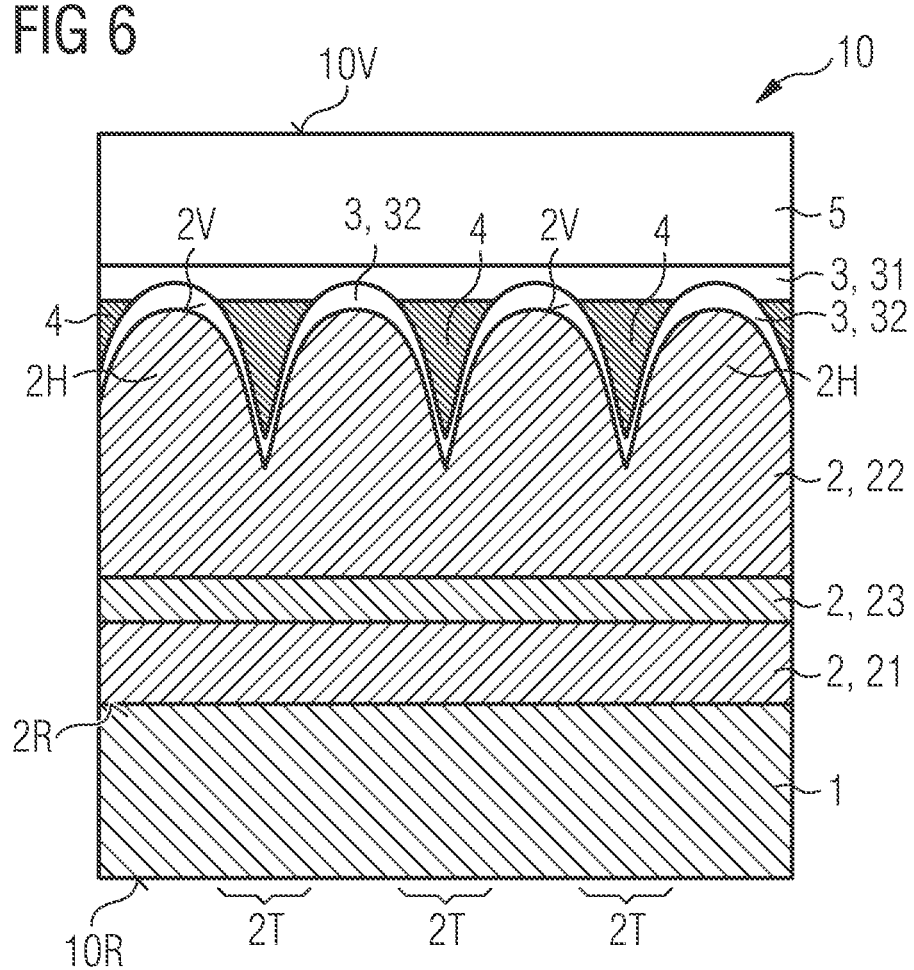

The exemplary embodiment of a component 10 shown in FIG. 6 essentially corresponds to the exemplary embodiment shown in FIG. 4. In contrast, FIG. 6 shows that the component 10 has a carrier 1 on which the semiconductor body 2 is arranged. The carrier 1 may be a substrate, a semiconductor substrate, a sapphire substrate, in particular a growth substrate, on which the semiconductor body 2 is epitaxially grown. However, the carrier 1 may be different from a growth substrate. The component may be free of a growth substrate, which is removed after the semiconductor body is grown. For example, the carrier 1 is a metal, plastic or ceramic body. The component 10 has a rear side 10R formed by an exposed surface of the carrier 1. For example, a front side of the carrier 1 is directly adjacent to a rear side 2R of the semiconductor body 2. In particular, the carrier 1 is a chip carrier.

The semiconductor body 2 has a first, in particular p-type semiconductor layer 21, a second, in particular n-type semiconductor layer 22 and an active zone 23 arranged between the first semiconductor layer 21 and the second semiconductor layer 22. The first semiconductor layer 21 faces the carrier 1. The second semiconductor layer 22 faces away from the carrier 1. It is also possible that the first semiconductor layer 21 is n-type and the second semiconductor layer 22 is p-type. Both the first semiconductor layer 21 and the second semiconductor layer 22 can be formed as a single layer or as a layer sequence comprising several partial layers.

In particular, an active zone 23 refers to an active zone in the semiconductor body 2 wherein electromagnetic radiation is generated during operation of the component 10. In particular, the active zone 23 comprises a pn-junction region, a quantum well structure, or a multiple quantum well structure. For example, the semiconductor body 2 is based on GaN, InGaN, InGaAlN, InGaP, InGaAlP, or on AlGaAs. Also, the semiconductor body 2 may be formed of another III/V or II/VI compound semiconductor material. All of the components 10 shown in FIGS. 1 to 5 may have a semiconductor body 2 and carrier 1 as shown in FIG. 6. The component 10 may be disposed on a heat sink, wherein the carrier 1 in particular immediately adjoins the heat sink.

FIGS. 7A, 7B, 7C and 7D show some steps of a method for producing a component 10. According to FIG. 7A, a semiconductor body 2 having a structured surface 2V is provided, which has local elevations 2H and local recesses 2T. The local elevations 2H and the local recesses 2T may have a vertical height or a vertical depth between 1 µm and 3 µm, inclusive. A lateral distance between two peaks of the elevations 2H may be between 2 µm and 6 µm, inclusive. The structured surface 2V may be formed exclusively by surface of a semiconductor layer 22 as shown in FIG. 6, wherein the semiconductor layer 22 may be n-type or p-type. The semiconductor body 2 is based in particular on GaN.

Figure 7A:
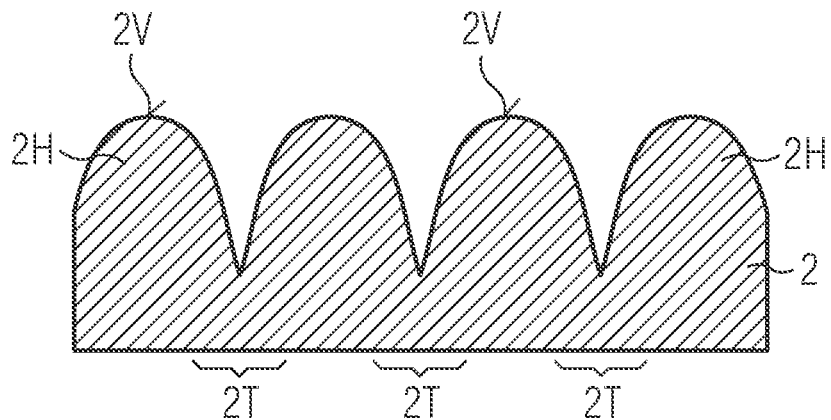
Figure 7B:
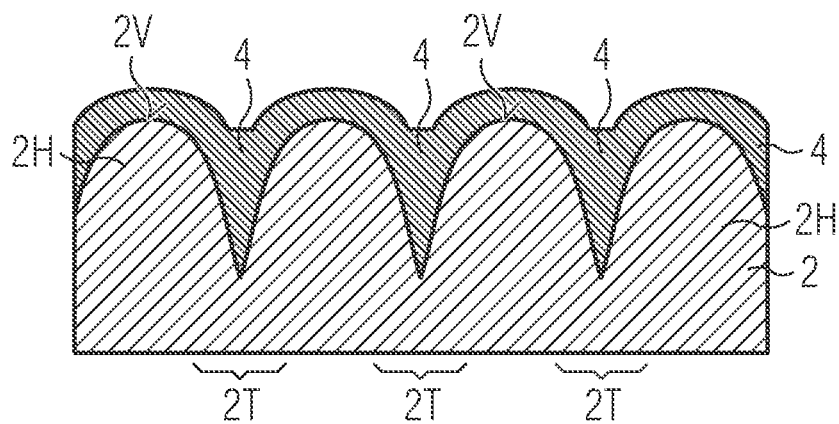

According to FIG. 7B, the filling layer 4 is applied to the semiconductor body 2. The filling layer 4 can completely cover the structured surface 2V and in particular completely fill the recesses 2T. In particular, the filling layer 4 initially protrudes along the vertical direction beyond the elevations 2H. The filling layer 4 may be formed of SiO2.

Figure 7C:
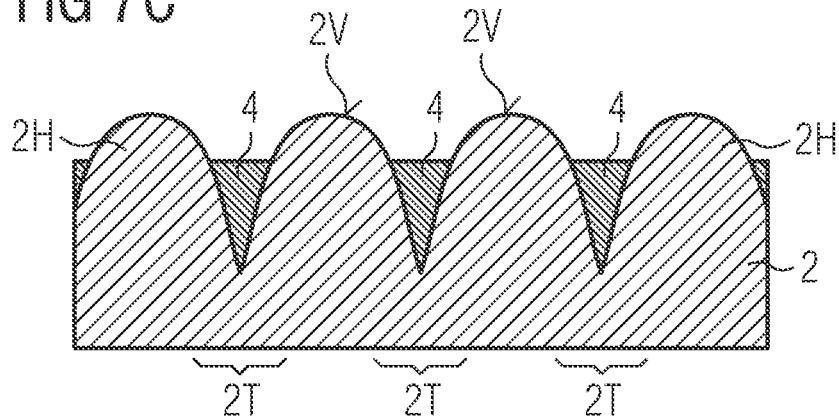

The filling layer 4 can then be polished in such a way that the elevations 2H now project beyond the filling layer 4, for example by a height between 50 nm and 500 nm inclusive or between 50 nm and 200 nm inclusive. In particular, the semiconductor body 2 has a higher mechanical hardness than the filling layer 4. During polishing, particles can be used whose mechanical hardness is comparable to that of the filling layer 4 and in particular is lower than that of the semiconductor body 2. For example, the particles have a higher, equal or slightly lower mechanical hardness than the filling layer. The semiconductor body 2 may serve as a polishing stop layer. While the material of the semiconductor body 2 is not removed, the filling layer 4 can still be removed so that the elevations 2H extend beyond the filling layer 4. In FIG. 7C, it is shown that the filling layer 4 has substantially a flat exposed surface. However, it is possible that the exposed surface of the filling layer 4 is curved in certain places, for example concave curved.

According to FIG. 7D, the converter layer 5 is mechanically attached to the polished filling layer 4 or to the structured surface 2V of the semiconductor body 2 by an intermediate layer 3 formed as a connecting layer 31. The exemplary embodiment of a component 10 shown in FIG. 7D corresponds to the exemplary embodiment shown in FIG. 2.

The example of a method step shown in FIG. 8A essentially corresponds to the example shown in FIG. 7C. In contrast, after polishing of the filling layer 4, a planarization layer 33 is applied to the filling layer 4 in such a way that the planarization layer 33 covers, in particular completely covers, the filling layer 4 and the elevations 2H.

According to FIG. 8A, the planarization layer 33 initially runs conformally with the elevations 2H in certain places. In a subsequent method step, the planarization layer 33 is polished or surface-grinded according to FIG. 8B in such a way that it has a flat or planar surface facing away from the semiconductor body 2 which can have an average roughness in particular of less than 100 nm, 50 nm, 30 nm, 10 nm or less than 5 nm, for instance between 100 nm and 1 nm. In particular, the planarization layer 33 forms the intermediate layer 3.

According to FIG. 8C, the converter layer 5 is mechanically attached to the planarization layer 33 by a connecting layer 31. The exemplary embodiment of a component 10 shown in FIG. 8C corresponds to the exemplary embodiment shown in FIG. 3. Due to the planarization layer 33 having the flat or planar surface, the connecting layer 31 may have a particularly thin configuration. In particular, the connecting layer 31 has a substantially constant vertical layer thickness along the lateral directions.

The exemplary embodiment of a method step shown in FIG. 9A essentially corresponds to the example shown in FIG. 8B. In contrast, a protection layer 34 is formed on the planarization layer 33 before the converter layer 5 is attached. The protection layer 34 may be an oxide layer, for instance a SiO2 layer. In particular, the protection layer 34 has a lower mechanical hardness than the planarization layer 33. Because of the lower mechanical hardness, the protection layer 34 can be planarized in a particularly simplified manner, for example by a chemical-mechanical planarization process. If the planarization layer 33 for instance from Al2O3 is already planarized and the protection layer 34 is formed as a thin layer on the planarized planarization layer 33, the step for planarizing the protection layer 34 can be omitted. For example, the protection layer 34 has a flat or planar surface facing away from the semiconductor body 2, which has a lower roughness than a surface of the planarization layer 33 facing away from the semiconductor body 2.

According to FIG. 9B, the converter layer 5 is mechanically attached to the protection layer 34 by a connecting layer 31. As schematically shown in FIG. 9B, the intermediate layer 3 can be formed by a layer sequence of the planarization layer 33, the protection layer 34 and/or the connecting layer 31 or exclusively of one of these layers. The exemplary embodiment of a component 10 shown in FIG. 9B is substantially the same as the exemplary embodiment shown in FIG. 8C but with the protection layer 34.

In a departure from FIGS. 8C and 9B, it is possible for the component 10 to be free of a connecting layer 31. In particular, the converter layer 5 may be directly adjacent to a planar surface of the planarization layer 33 or the protection layer 34. In this case, the converter layer 5 can be mechanically attached to such a planar surface by a direct bonding process. With the aid of the protection layer 34, a particularly planar surface can be created which facilitates the attachment of the converter layer 5, in particular by the direct bonding process.

Figure 10A:
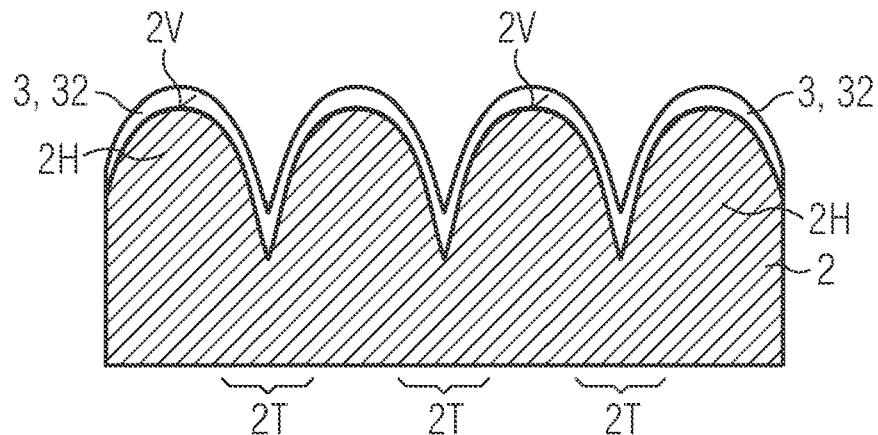

The example of a method step shown in FIG. 10A essentially corresponds to the exemplary embodiment shown in FIG. 7A. In contrast thereto, the structured surface 2V is provided with a passivation layer 32, which runs in particular conformally with the structured surface 2V. A vertical layer thickness of the passivation layer 32 may be between 30 nm and 300 nm, for example between 40 nm and 200 nm.

Figure 10B:
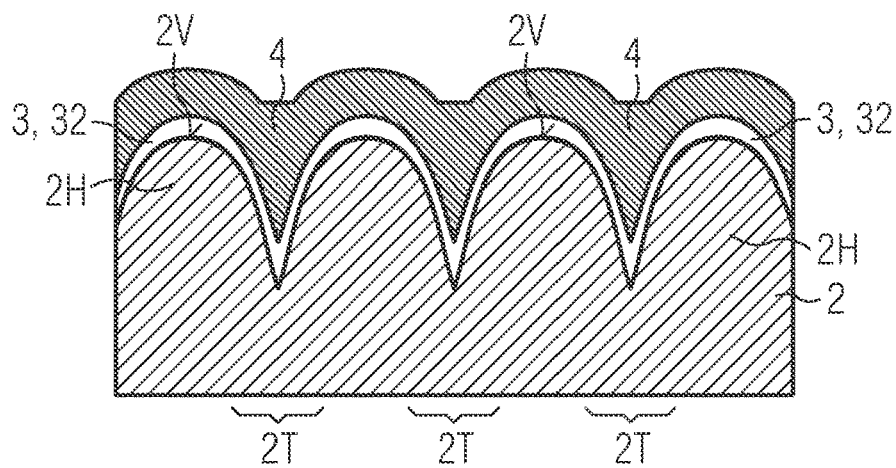
Figure 10C:
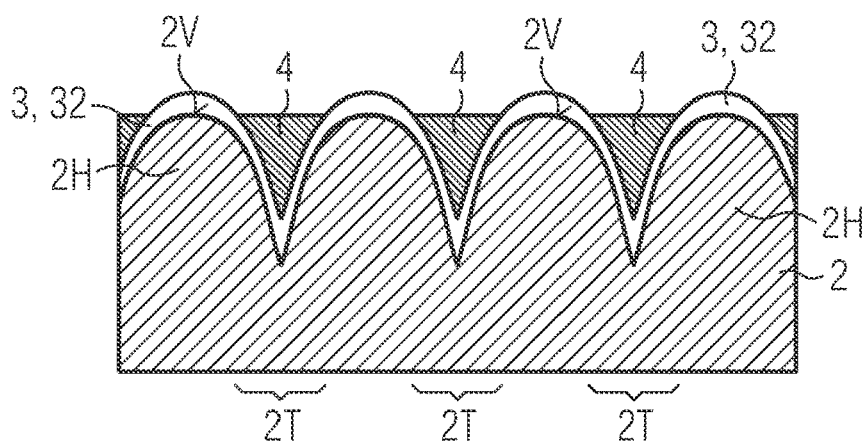

Analogous to FIG. 7B, the filling layer 4 is formed on the passivation layer 32 according to FIG. 10B, wherein the filling layer 4 first completely covers the passivation layer 32 and then is polished according to FIG. 1C in such a way that the passivation layer 32 projects beyond the filling layer 4 in certain places, for example by a height of between 50 nm and 500 nm or between 50 nm and 200 nm. In particular, the passivation layer 32 has a higher mechanical hardness than the filling layer 4 and can serve as a polishing stop layer during polishing. In particular, the intermediate layer 3 is formed by the passivation layer 32, for instance exclusively by the passivation layer 32.

Figure 10D:
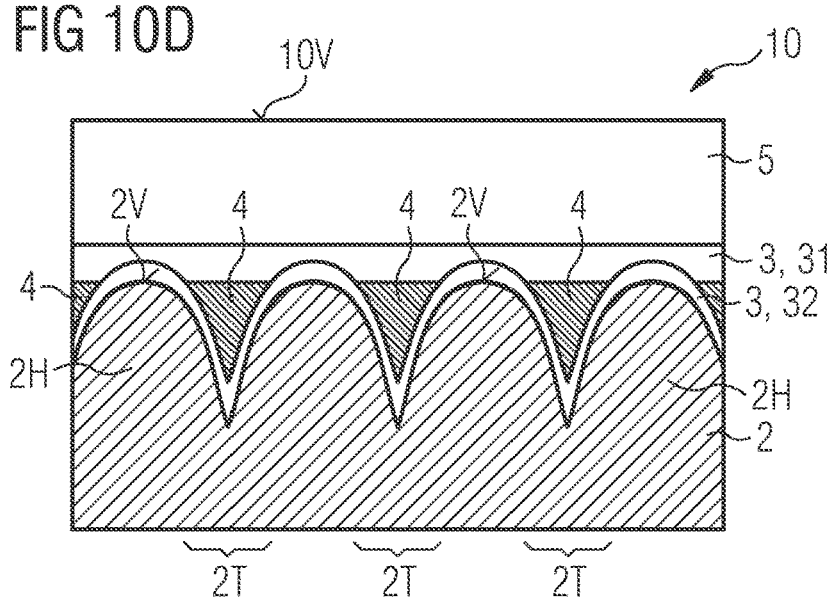

According to FIG. 10D, the converter layer 5 is attached to the semiconductor body 2 by a connecting layer 31. The exemplary embodiment of a component 10 shown in FIG. 10D corresponds to the exemplary embodiment shown in FIG. 4.

Figure 11A:
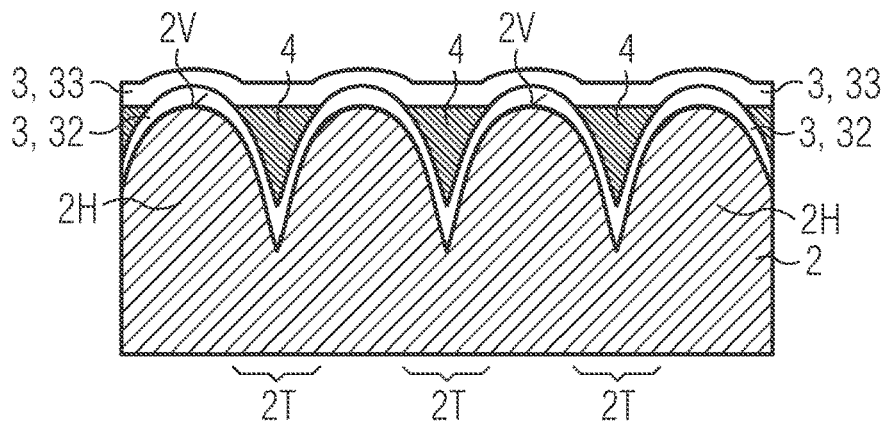

The example of a method step shown in FIG. 11A essentially corresponds to the example shown in FIG. 1C. In contrast, a planarization layer 33 is formed on the passivation layer 32 analogously to the exemplary embodiment shown in FIG. 8A in order to counteract the dishing effect. For example, the passivation layer 32 protrudes beyond the filling layer 4 by a height of 100 nm. In this case, the planarization layer 33 should be thicker than 100 nm. For example, the planarization layer 33 has a vertical layer thickness of 200 nm.

Figure 11B:
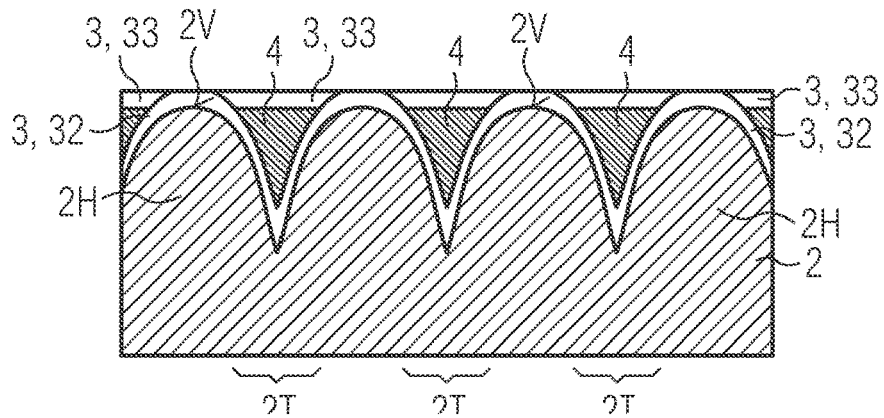

Analogous to the exemplary embodiment shown in FIG. 8B, according to FIG. 11B, the planarization layer 33 is polished in such a way that it has a flat or planar surface facing away from the semiconductor body 2. Over the peaks of the elevations 2H, the sum of the thicknesses of the passivation layer 32 and the planarization layer 33 may be, for example, between 50 nm and 150 nm, around 70 nm, 90 nm or 100 nm.

According to FIG. 11B, the planar or flat surface facing away from the semiconductor body 2 is formed as a hybrid surface, which is formed in places by the surface of the planarization layer 33 and in places by the surface of the passivation layer 32. Deviating from this, it is possible that the planar or flat surface facing away from the semiconductor body 2 is formed exclusively by the surface of the planarization layer 33.

On the planar or flat surface, the converter layer 5 can be attached by a connecting layer 31 or, according to FIG. 11C, by a direct bonding process. The exemplary embodiment of a component 10 shown in FIG. 11C corresponds to the exemplary embodiment shown in FIG. 5.

The exemplary embodiments illustrated in FIGS. 12A and 12B are substantially the same as the exemplary embodiments illustrated in FIGS. 11B and 11C. In contrast, the component 10 has a protection layer 34 that is flat or planar, analogous to the protection layer 34 shown in FIGS. 9A and 9B. The features of the protection layer 34 described in connection with FIGS. 9A and 9B can therefore also be used for the exemplary embodiments illustrated in FIGS. 12A and 12B.

The invention is not restricted to the exemplary embodiments by the description of the invention made with reference to the exemplary embodiments. The invention rather comprises any novel feature and any combination of features, including in particular any combination of features in the claims, even if this feature or this combination is not itself explicitly indicated in the patent claims or exemplary embodiments.

The invention claimed is:

1. A component comprising:
 a semiconductor body;
 a converter layer;
 a filling layer; and
 an intermediate layer arranged in a vertical direction between the semiconductor body and the converter layer,
 wherein the semiconductor body has a surface that faces the converter layer, is structured and has vertical recesses,
 wherein the vertical recesses are filled with a material of the filling layer that has a higher thermal conductivity than silicone,
 wherein the intermediate layer or the semiconductor body has a higher mechanical hardness than the filling layer,
 wherein the intermediate layer comprises a passivation layer,
 wherein at the vertical recesses, the passivation layer is arranged between the semiconductor body and the filling layer, and outside the recesses, the passivation layer projects beyond the filling layer in places along the vertical direction, and
 wherein the structured surface of the semiconductor body has local elevations and local recesses, the structured surface comprising exclusively the surface of an n-type semiconductor layer or a p-type semiconductor layer.

2. The component according to claim 1, wherein the semiconductor body has the higher mechanical hardness than the filling layer and projects beyond the filling layer in regions along the vertical direction.

3. The component according to claim 1, wherein the semiconductor body is configured to generate electromagnetic radiation of a first peak wavelength, wherein the converter layer is configured to convert the electromagnetic radiation of the first peak wavelength into electromagnetic radiation of a second peak wavelength, and wherein the second peak wavelength is larger than the first peak wavelength.

4. The component according to claim 1, wherein the material of the filling layer has a thermal conductivity of at least 0.5 W/(m·K).

5. The component according to claim 1, wherein the material of the filling layer has a lower thermal conductivity than the semiconductor body.

6. The component according to claim 1, wherein the vertical recesses have an average vertical depth between 0.2 µm and 5 µm inclusive.

7. The component according to claim 1, wherein the intermediate layer comprises a connecting layer arranged in the vertical direction between the filling layer and the converter layer.

8. The component according to claim 1, wherein the intermediate layer comprising the passivation layer runs regionally in conformity with the structured surface of the semiconductor body.

9. The component according to claim 1, further comprising a planarization layer which, in top view, completely covers the filling layer and has a flat or planar surface facing the converter layer.

10. The component according to claim 1, further comprising a protection layer arranged between the converter layer and the semiconductor body, wherein the protection layer has a constant vertical layer thickness along lateral directions and directly or exclusively adjoins the converter layer except for a connecting layer.

11. A light source comprising:
 the component according to claim 1.

12. A method for producing the component according to claim 1, the method comprising:
 providing the semiconductor body with a structured surface having the vertical recesses;
 filling the recesses with the material of the filling layer;
 polishing the filling layer, wherein the intermediate layer or the semiconductor body serves as a polishing stop layer due to the higher mechanical hardness and projects beyond the filling layer in regions along the vertical direction after polishing; and applying the converter layer onto the polished filling layer.

13. The method of claim 12,
wherein, after polishing, the semiconductor body protrudes in regions along the vertical direction beyond the filling layer,
wherein, after polishing, the intermediate layer is applied onto the regionally exposed semiconductor body, and
wherein the intermediate layer is subsequently plane-polished, as a result of which it has a plane or planar surface facing away from the semiconductor body.

14. The method of claim 12,
wherein, prior to forming the filling layer, the intermediate layer is applied onto the semiconductor body so that the intermediate layer partially fills the recesses,
wherein the recesses are completely filled with the material of the filling layer,
wherein the filling layer is polished, and
wherein the intermediate layer underneath serves as the polishing stop layer due to its higher mechanical hardness and projects beyond the filling layer in regions along the vertical direction after polishing.

15. The method according to claim 14, further applying a planarization layer to the filling layer and to the regionally exposed intermediate layer, wherein the planarization layer is subsequently plane-polished, as a result of which it has a flat or planar surface facing away from the semiconductor body.

16. The method according to claim 12, further comprising attaching the converter layer to the semiconductor body by glass solder.

17. The method according to claim 12, further comprising attaching the converter layer to the semiconductor body by a direct bonding process.

18. A component comprising:
a semiconductor body;
a converter layer;
a filling layer; and
an intermediate layer arranged in vertical direction between the semiconductor body and the converter layer,
wherein the semiconductor body has a surface that faces the converter layer, is structured and has vertical recesses,
wherein the vertical recesses are filled with a material of the filling layer that has a higher thermal conductivity than silicone,
wherein the intermediate layer or the semiconductor body has a higher mechanical hardness than the filling layer,
wherein, in top view of the structured surface of the semiconductor body, the filling layer is continuous, and
wherein the structured surface of the semiconductor body has local elevations and local recesses, the structured surface comprising exclusively the surface of an n-type or a p-type semiconductor layer.

19. The component according to claim 1, wherein, in top view, the filling layer comprising the passivation layer is continuous and has a plurality of openings from which peaks of the passivation layer protrude.

20. The component according to claim 1, wherein the intermediate layer has the higher mechanical hardness than the filling layer and extends in regions into the recesses, and wherein the intermediate layer runs conformally with the structured surface of the semiconductor body.

* * * * *